(12) United States Patent
Ha et al.

(10) Patent No.: US 6,429,485 B1
(45) Date of Patent: *Aug. 6, 2002

(54) THIN FILM TRANSISTOR AND METHOD OF FABRICATING THEREOF

(75) Inventors: Yong-Min Ha, Anyang-Shi; Jae-Deok Park, Seoul, both of (KR)

(73) Assignee: LG. Philips LCD Co., Ltd., Seoul (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,050

(22) Filed: Nov. 13, 1998

(30) Foreign Application Priority Data

Nov. 15, 1997 (KR) ............................ 97-60199

(51) Int. Cl.[7] .............................. H01L 27/01
(52) U.S. Cl. ...................... 257/351; 257/369
(58) Field of Search ................ 257/351, 369, 257/408, 632

(56) References Cited

U.S. PATENT DOCUMENTS 3,890,632 A * 6/1975 Ham et al. ................. 257/354
5,292,675 A 3/1994 Codama ....................... 437/44
5,323,042 A * 6/1994 Matsumoto ................. 257/351
5,757,048 A * 5/1998 Inoue ......................... 257/408
6,031,249 A * 2/2000 Yamazaki et al. .......... 257/351

* cited by examiner

Primary Examiner—Mark V. Prenty
(74) Attorney, Agent, or Firm—McKenna Long & Aldridge LLP

(57) ABSTRACT

A thin film transistor (TFT) has lightly doped drains which includes heavily doped regions and lightly doped regions. The lightly doped drains are formed simultaneously by a single doping process through a gate insulating layer having different thicknesses. The TFT is fabricated by forming an active layer on an insulated substrate, forming an insulating layer on the active layer, forming a conductive layer on the insulating layer, forming a photoresist pattern on the conductive layer, forming a gate electrode by over etching the conductive layer by using the photoresist pattern as a mask. The first insulating layer is then partially etched by using the photoresist pattern as a mask. As a result, the portions of the first insulating layer overlapped by the photoresist pattern is thicker than the other portions not overlapped by the photoresist pattern. When the entire TFT is induced to impurities, the active regions substantial below the thicker insulating region form the lightly doped drains.

18 Claims, 9 Drawing Sheets

N-TYPE LDD TFT     P-TYPE LDD TFT

THIN FILM TRANSISTOR AND METHOD OF FABRICATING THEREOF

BACKGROUND OF THE INVENTION

1. Field of Invention

The present invention relates to a method of fabricating a thin film transistor (TFT) which enables heavily doped regions and lightly doped regions to form simultaneously by a single doping process by differentiating the thickness of a gate insulating layer.

2. Discussion of Related Art

A current driving efficiency of a polycrystalline TFT is higher than that of an amorphous silicon TFT during its on-state, while a leakage current of the polycrystalline TFT is higher than that of the amorphous silicon TFT during its off-state. When switching devices in a pixel array are comprised of polycrystalline TFTs, image display performance of a liquid crystal display (LCD) is decreased by a signal value stored in a pixel electrode wherein the signal value varies due to a relatively large leakage current during the off-state. That is why techniques of forming switches which have structures of LDD (lightly doped region) or offset have been proposed for poly silicon TFTs.

FIGS. 1A to 1D show a method of fabricating an LDD TFT according to a related art. Referring to FIG. 1A, an active layer 11 is defined by patterning a polycrystalline silicon layer which has been formed on an insulated substrate 10. The polycrystalline silicon layer may be formed by depositing amorphous silicon on the insulated substrate 10 and then by crystallizing the amorphous silicon with dehydrogenation and a laser annealing process. After that, a first insulating layer 13L and a first conductive layer 15L are formed in order on the disclosed surfaces of the active layer 11 and the insulated substrate 10. Then, a photoresist pattern (PR) for forming a gate is defined by a photoresist coating, selective exposure and development.

Referring to FIG. 1B, a gate electrode 15 is formed by etching the first conductive layer 15L by using the photoresist pattern (PR) as an etching mask. After the photoresist pattern has been removed, a gate insulating layer 13 is defined by patterning the first insulating layer 13L by using the gate electrode 15 as an etching mask.

Referring to FIG. 1C, a doping-blocking layer B is formed to cover the gate region including the gate electrode 13 and the gate insulating layer 15 and also to cover its peripheral region. The doping-blocking layer B may be formed by using a photoresist. Each of 'LL' and 'LR', which represents LDD regions, in the drawing depicts a length which is covered by the doping-blocking layer B but not overlapped with the gate electrode 15. The doping-blocking layer B defines the boundaries of LDD regions in the active layer 11. Thereafter, a source region 11S and a drain region 11D are formed by doping heavily the exposed parts of the active layer 11 with n typed impurities.

Referring to FIG. 1D, the LDD region 11L in the active layer 11 is lightly doped with the n typed impurities by a lightly doping process after the doping-blocking layer B has been removed. In this case, having been doped heavily with the n typed impurities, the source region 11S and the drain region 11D are not affected by the density of impurities during the lightly doping process. Then, the regions having been doped with the impurities are activated by a thermal treatment or a laser annealing of the substrate.

In order to form the LDD region, the related art has a problem of adding a series of complicated steps, such as a doping-blocking layer, lightly doping with impurities, activating the impurities and the like, thereby requiring multiple processes.

Moreover, as the LDD region is defined by the doping-blocking layer, the LDD region is difficult to be patterned symmetrically when the channel is taken as a given center. In other words, each length of the left and the right LDD region represented respectively by 'LL' and 'LR' shown in FIG. 1C is not identical to each other. That results from such factors as a bent substrate, a mis-alignment of the doping-blocking layer, etc.

SUMMARY OF THE INVENTION

Accordingly, the present invention is directed to a method of fabricating a thin film transistor that substantially obviates one or more of the problems due to limitations and disadvantages of the related art.

The object of the present invention is to provide a method of fabricating a thin film transistor which enables heavily doped regions and lightly doped regions to form simultaneously by a single doping process by differentiating the thickness of a gate insulating layer. The present invention uses impurity distribution to a depth direction in accordance with a range of projection.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming an active layer on an insulated substrate, forming a first insulating layer on the active layer, forming a first conductive layer on the first insulating layer, forming a first photoresist pattern on the first conductive layer, forming a gate electrode within a scope of the first photoresist pattern by over-etching the first conductive layer by using the first photoresist pattern as an etch mask, partially etching the first insulating layer by using the first photoresist pattern as an etch mask, wherein a part of the first insulating layer which is overlapped with the first photoresist pattern is thicker, removing the first photoresist pattern, and doping heavily a surface of the substrate with impurities.

In another aspect of the present invention, the present invention having a first typed transistor and a second typed transistor includes the steps of forming active layers for the first typed transistor and the second typed transistor on an insulated substrate, forming a first insulating layer on the active layers, forming a first conductive layer on the first insulating layer, forming first photoresist patterns on the first conductive layer wherein each of the first photoresist patterns is overlapped with predetermined portions of the active layers, forming gate electrodes for the first typed and the second typed thin film transistors within each scope of the first photoresist patterns by over-etching the first conductive layer by using the first photoresist patterns as etch masks, under-etching the first insulating layer of the first photoresist patterns as etch masks wherein parts of the first insulating layer which are overlapped with the first photoresist patterns is thicker than is not, removing the first photoresist patterns, forming a heavily-doped first typed impurity region and a lightly-doped first typed impurity region in the active region of the first typed thin film transistor by doping the first typed thin film transistor with first typed impurities, and forming a heavily-doped second typed impurity region and a lightly-doped second typed impurity region in the active region of the second typed thin film transistor by doping the second typed thin film transistor with second typed impurities.

In a further aspect of the present invention, the present invention having a first typed transistor and a second typed transistor includes the steps of forming each active layer of the first typed and the second typed TFT on an insulated substrate, forming a first insulating layer covering the active layers, forming a first conductive layer on the first insulating layer, forming first photoresist patterns on the first conductive layer wherein each of the first photoresist pattern is overlapped with predetermined portions of each of the active layers, forming a first and a second gate of the first and said second typed thin film transistor respectively, wherein each of the gates is formed by over-etching the first conductive layer by using the first photoresist patterns as etch masks, and wherein each of the gates lies within a scope of each of the first photoresist patterns, under-etching the first insulating layer by using the first photoresist patterns as etch masks wherein parts of the first insulating layer overlapped with the first photoresist patterns is thicker, removing the first photoresist patterns, forming a lightly-doped first typed impurity region and a heavily-doped first typed impurity region by doping the active layer of the first typed thin film transistor with first typed impurities, forming a blocking layer covering the first typed thin film transistor, exposing portions of the active layer of the second typed thin film transistor by etching the first insulating layer by using the blocking layer and the gate electrode of the second typed thin film transistor, and forming a heavily-doped second typed impurity region by doping heavily the exposed portions of the active layer of the second typed thin film transistor with second-typed impurities.

In a further aspect of the present invention, the present invention having CMOS thin film transistors, comprising: an insulated substrate; a first typed transistor further comprising: an active layer comprised of a heavily-doped impurity region/a lightly-doped impurity region/a channel region; a gate insulating layer comprised of a first part of first thickness and a second part of second thickness on said active layer, said first part overlapped with said heavily-doped impurity region, said second part overlapped with said lightly-doped region and said channel region; and a gate electrode on said gate insulating layer over said channel region; a second typed transistor further comprising: an active layer having a heavily-doped impurity region and a channel region on said insulated substrate; a gate insulating layer on said active layer, said gate insulating layer of first thickness; and a gate electrode on said gate insulating layer over said channel region; a passivation layer covering said first typed transistor and said second typed transistor; a plurality of contact holes in said passivation layer, said contact holes exposing said heavily-doped impurity regions of said first typed transistor and said second typed transistor; and a plurality of wires connecting said heavily-doped impurity region of said first typed transistor with said heavily-doped impurity region of second typed transistor to form CMOS transistors through said contact holes.

In the above process, the over-etching may be carried out isotropically and the under-etching may be processed anisotropically.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

Reference will now be made in detail to the preferred embodiment of the present invention, an example of which is illustrated in the accompanying drawings.

A doping process with impurities in a silicon layer is explained in the following description. The impurities penetrate into a silicon layer, collide with silicon particles in their lattices, and then stop at a certain depth of the silicon layer from a surface of the silicon layer. In such case, the impurities can be located at the proper spots and depth in the silicon layer by controlling their acceleration. The same principle may be applied to an impurity doping process of an insulating layer. The impurities during the doping process of the silicon layer have mobility driven by applied electricity, while those of the insulating layer do not.

Figure 1A:
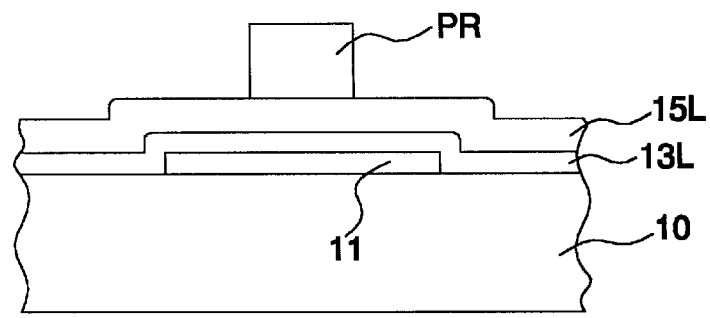
FIGS. 1A to 1D are cross-sectional views of TFT fabricating steps according to related art.
Figure 1B:
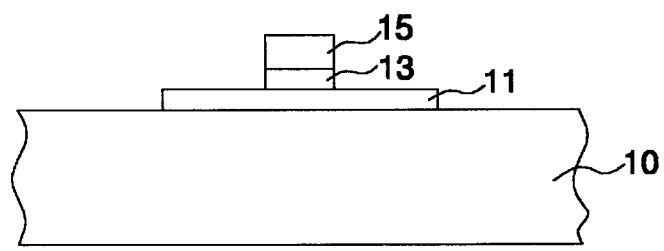
Figure 1C:
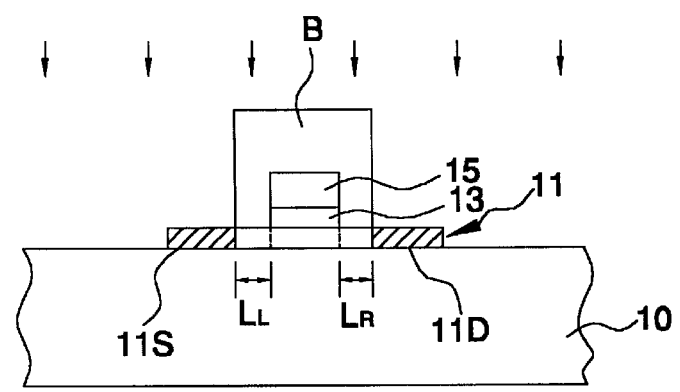
Figure 1D:
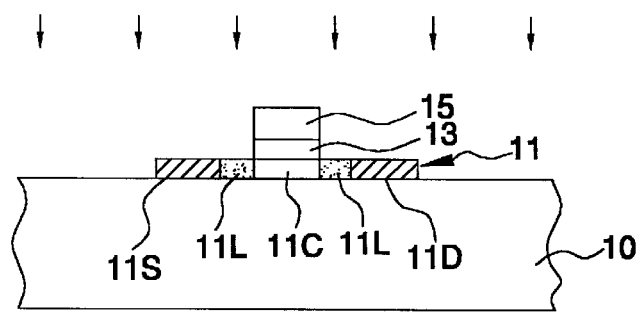
Figure 2:
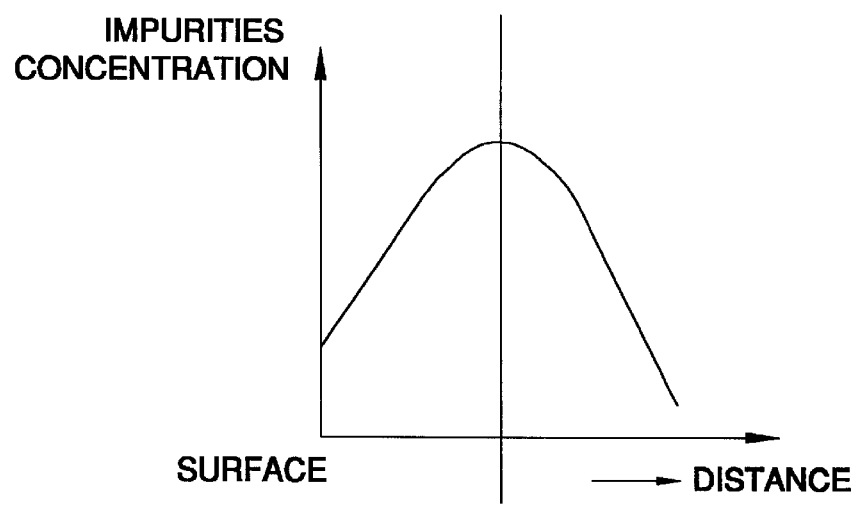
FIG. 2 shows a distribution profile of impurities by a Gaussian approximation.

A mean value of migrating distances of impurities and a standard deviation of distribution follow a Gaussian approximation as shown in FIG. 2. FIG. 2 shows a profile of impurities according to Gaussian approximation.

Figure 3:
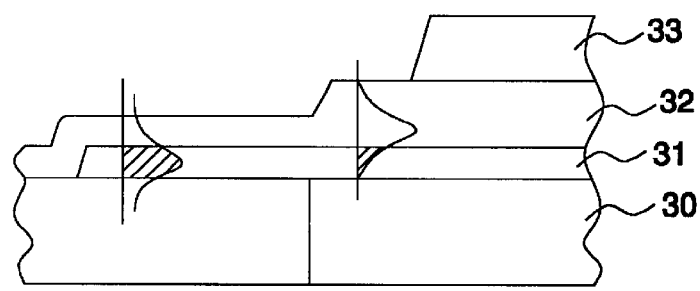
FIGS. 3 shows the content of impurities contained in a silicon layer in accordance with the thickness of a gate insulating layer.

Taking an example of forming heavily and lightly doped regions simultaneously by doping through a gate insulating layer of varying thickness, FIG. 3 illustrates impurity contents in a silicon layer according to the thickness of a gate insulating layer.

Referring to FIG. 3, an active layer 31 of polycrystalline silicon is formed on an insulated substrate 30. A gate insulating layer 32 covers the active layer 31. Then, a gate electrode 33 is formed on the gate insulating layer 32. Specially, the gate insulating layer 32 is formed to have a step-like varying thickness. An active layer 31 under an insulating layer 32 is doped with different impurities in accordance with the insulating layer's thickness.

A Gaussian distribution applies to the doping impurities. A maximum density of the impurities passing through a thin part of the gate insulating layer 32 is heavily distributed in the active layer 31, while a maximum density of the impurities passing through a thick part of the gate insulating layer 32 is lightly distributed in the gate insulating layer. Thus, the characteristic of the impurity distribution contributes to the difference in doping of the active layer 31. Namely, the impurities of various density are distributed in the silicon layer by differentiating the migration distances of reaching the silicon layer by controlling the thickness of the gate insulating layer.

Accordingly, the impurities are lightly distributed in the active layer on which the thicker gate insulating layer lies, while the other impurities are heavily distributed in the active layer on which the thinner gate insulating layer lies. Both heavily and lightly doped regions are formed simultaneously by a single doping process once the gate insulating layer covering the active layer is formed to have differentiated thickness.

Figure 4A:
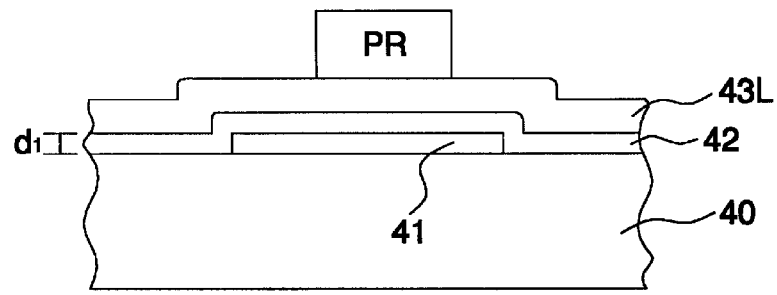
FIGS. 4A to 4E are cross-sectional views of TFT fabricating steps according to a first embodiment of the present invention.

FIGS. 4A to 4E are cross-sectional views of TFT steps according to a first embodiment of the present invention. Referring to FIG. 4A, an amorphous silicon layer is crystallized to form a polycrystalline silicon layer by dehydrogenating and annealing the amorphous silicon layer formed on an insulated substrate 40. Then, an active layer 41 is formed by patterning the polycrystalline silicon layer with photolithography.

A first conductive layer 43L is formed on a gate insulating layer 42 after the gate insulating layer 42 covering the active layer 41 has been formed. A photoresist pattern (PR) for forming a gate is defined on the first conductive layer 43L. In this case, the gate insulating layer 42 having a predetermined thickness $d_1$ may be formed by depositing a suitable material, such as silicon oxide, silicon nitride or the like, by PECVD. Then, the first conductive layer 43L may be formed by depositing a suitable metal, such as Mo, Cr or the like, by a sputtering method.

Figure 4B:
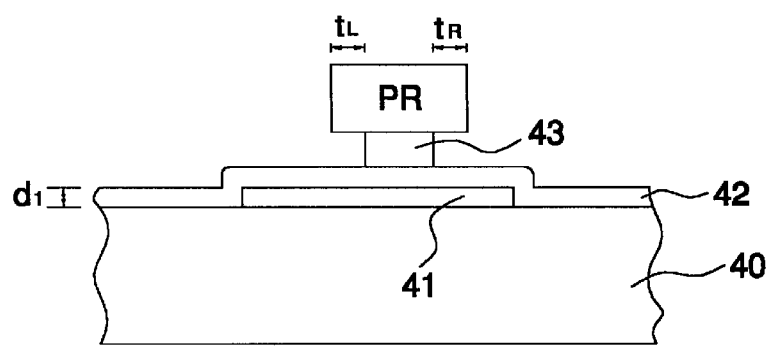

Referring to FIG. 4B, a gate electrode 43 is formed by etching the first conductive layer not protected by the photoresist pattern (PR) for forming a gate. The first conductive layer 43L forms the gate electrode 43 by using either a wet etching or dry etching method. In this case, the first conductive layer is preferably isotropically over-etched under the photoresist pattern (PR) to form the gate electrode 43 within the scope of the photoresist pattern (PR). Accordingly, both sides of the gate electrode 43 amounting to '$t_L$' and '$t_R$' are shortened on the bases of lateral boundaries of the photoresist pattern (PR). Resulted from an isotropic etch, the length $t_L$ is substantially equal to the other length $t_R$.

Figure 4C:
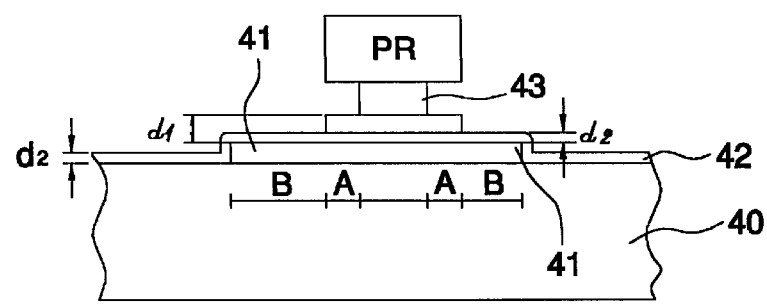

Referring to FIG. 4C, the portions of the gate insulating layer 42 which are not protected under the photoresist pattern (PR) are etched. Any suitable etching method known to one of ordinary skill in the art may be used. However, a dry-etching method is preferred. In this case, the etched portion of the gate insulating layer 42 has a thickness of $d_2$, but the non-etched portion of the gate insulating layer 42 overlapped with the photoresist pattern (PR) maintains a thickness of $d_1$ by a anisotropic etch. Accordingly, the portion of the gate insulating layer 42 not etched has a thickness of $d_1$ and the etched portions of the gate insulating layer 42 has a thickness of $d_2$.

Hereinafter for simplicity of description, a part of the active layer, which is under the gate insulating layer 42 having a thickness of $d_1$ and is not overlapped with the gate electrode 43, is called 'A region', while the other part of the active layer under the gate insulating layer having a thickness of $d_2$ is called 'B region'.

Figure 4D:
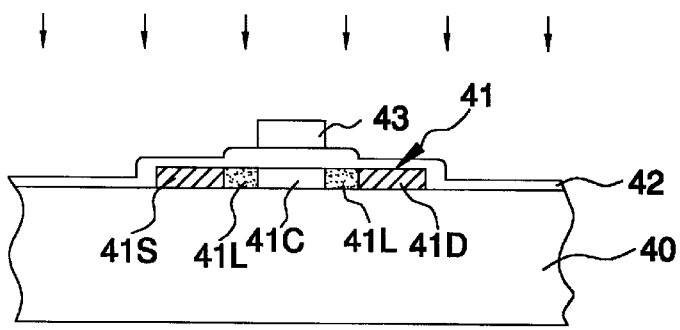

Referring to FIG. 4D, the exposed surface of the whole substrate 40 is heavily doped with n or p typed impurities after the photoresist pattern for forming a gate on the gate electrode 43 has been removed. As a result, an LDD region 41L is formed in the A region of the active layer 41 which is lightly doped with impurities. A source region 41S and a drain region 41D are formed in the B region of the active layer 41 and are heavily doped with the same impurities. Herein, a channel region 41C is defined between the source region 41S and the drain region 41D.

As explained in connection with FIG. 3 and FIG. 4, the lightly and the heavily doped regions are simultaneously formed in the active layer 41 by a single doping process because the impurities are implanted in the active layer according to Gaussian distribution. Namely, the source and the drain region are formed by a single doping process through a varying thickness of the gate insulating layer 42.

Figure 4E:
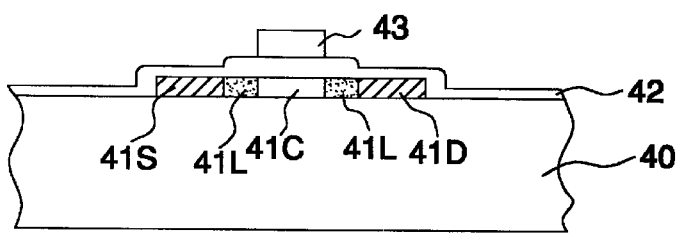

The LDD regions are formed since a small amount of the impurities are located in the active layer 41 on account of the gate insulating layer as a barrier. In order to properly distribute the impurities in the A and the B regions of the active layer 41, a dose and an acceleration energy of the impurities have to be appropriately adjusted according to the thicknesses $d_1$ and $d_2$ of the gate insulating layer. When the acceleration voltage is increased to 60~90 Kev and current density is increased to 10~20 $\mu A/cm^2$ in a doping process, the chamber is naturally heated. Thus, self-thermal activation takes place. Referring to FIG. 4E, an LDD TFT lies on the insulated substrate after the doping process with impurities has been finished.

FIGS. 5A to 5F show cross-sectional views of fabricating CMOS TFT comprised of an n typed LDD TFT and a p typed LDD TFT according to a second embodiment of the present invention.

Figure 5A:
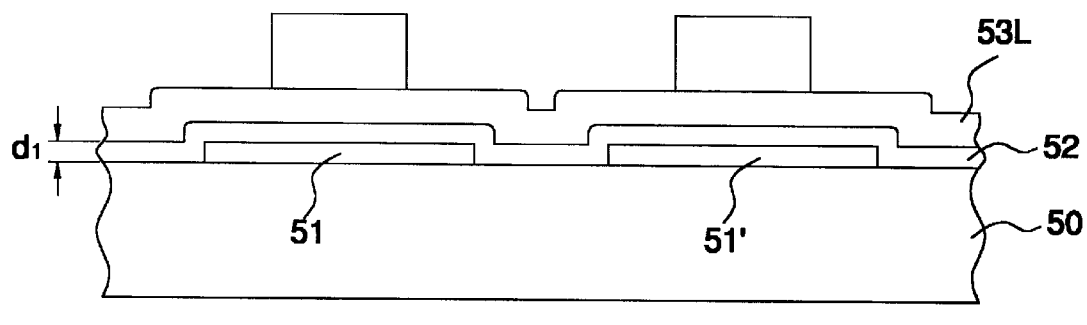
FIGS. 5A to 5F are cross-sectional views of TFT fabricating steps according to a second embodiment of the present invention.

Referring to FIG. 5A, a polycrystalline silicon layer is formed by crystallizing an amorphous silicon layer by a dehydrogenating and laser annealing after the amorphous silicon layer has been formed on an insulated substrate 50. Then, active layers 51 and 51' of an n typed LDD TFT and a p typed LDD TFT, respectively, are formed by patterning the polycrystalline silicon layer with photolithography.

Next, a gate insulating layer 52 is formed covering the active layers 51 and 51' and an exposed surface of the substrate. And then, a first conductive layer 53L is formed on the gate insulating layer 52. Photoresist patterns (PR) for forming a gate are defined on the first conductive layer 53L. In this case, the gate insulating layer may be formed to have a predetermined thickness such as 'd1' by forming an insulating material such as silicon oxide or silicon nitride by PECVD. The first conductive layer 53L is preferably formed by sputtering a metallic conductive material, such as Mo or Cr.

Figure 5B:
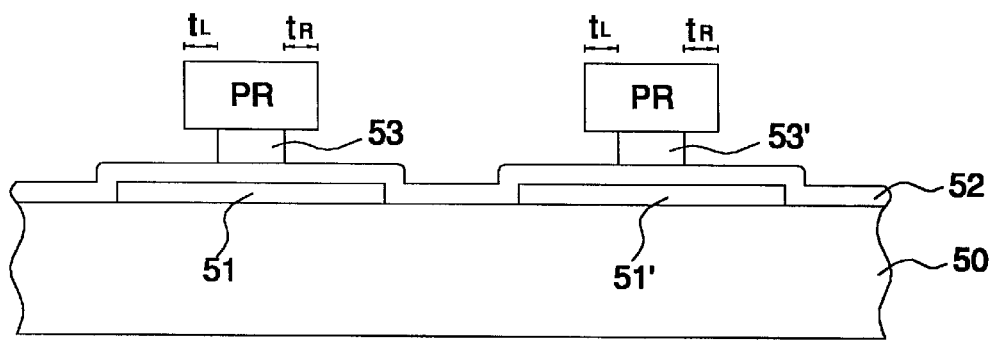

Referring to FIG. 5B, gate electrodes 53 and 53' of an n typed and a p typed LDD TFT are formed by etching the first conductive layer 53L not protected by the photoresist patterns (PR). Either a dry or wet etching method may be used. In this case, the first conductive layer 53L is isotropically over-etched under the photoresist pattern to form the gate electrodes 53 and 53' within the scope of each photoresist pattern (PR). Accordingly, both sides of the gate electrodes 53 and 53' amounting to '$t_L$' and '$t_R$', respectively, are shortened on the bases of lateral boundaries of the photoresist patterns (PR). Resulted from an isotropic etch, the length $t_L$ substantially equals to the length $t_R$.

Figure 5C:
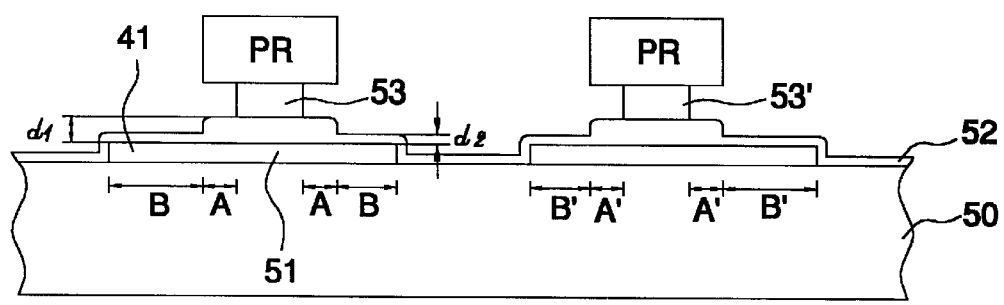

Referring to FIG. 5C, portions of the gate insulating layer 52, which are not under the photoresist patterns (PR) as etch masks, are etched. Any suitable etching method known to one of ordinary skill in the art may be used. However, a dry-etching method is preferred. In this case, the etched portions of the gate insulating layer 52 have a thickness of $d_2$, but the non-etched portions of the gate insulating layer 52 overlapped with the photoresist pattern (PR) maintain a thickness of $d_1$ by a unisotropic etch. Accordingly, the portions of the gate insulating layer 52 not etched have a thickness of $d_1$ and the etched portions of the gate insulating layer 52 have a thickness of $d_2$.

Hereinafter, each part of the active layers, which is under the gate insulating layer 52 having a thickness of $d_1$ and is not overlapped with the gate electrode, is called "A' region" and "A region" respectively, while another each part of the active layer under the gate insulating layer having a thickness of $d_2$ is called as "B' region" and "B region", respectively.

Figure 5D:
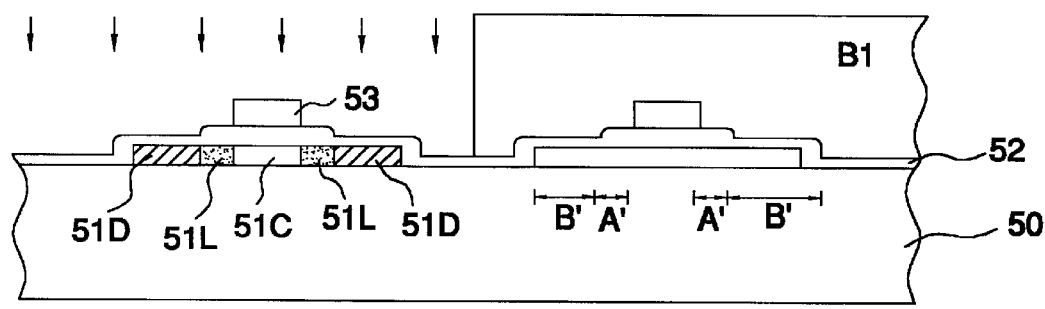

Referring to FIG. 5D, a first doping-blocking layer B1 blocking a p typed LDD TFT region is formed after the photoresist patterns on the gate electrodes 53 and 53' have been removed. The first doping-blocking layer B1 may be formed by using any suitable method, such as using a photoresist.

Then, the exposed surface of the whole substrate 50 is doped heavily with n typed impurities. As the gate insulating layer 52 of an n typed LDD TFT is not uniform in its thickness, an n typed LDD region 51L is formed in the A regions of the active layer which are lightly doped with impurities, while a source region 51S and a drain region 51D are formed in the B regions. which are heavily doped with the same impurities. Herein, a channel region 51C is defined between the source region 51S and the drain region 51D.

As explained by referring to FIG. 3 and FIG. 4, the lightly and the heavily doped regions are simultaneously formed in the active layer 52 by a single doping process because the impurities are located in the active layer according to Gaussian distribution. Namely, the source and the drain region are formed by a single doping process through a varying thickness of the gate insulating layer. In order to properly distribute the impurities in the A and the B regions of the active layer 52 respectively, a dose and an acceleration energy of the impurities have to be adjusted appropriately according to the thickness d1 and d2 of the gate insulating layer. When the acceleration voltage is increased to 60~90 Kev and current density is increased to 10~20 $\mu A/cm^2$ in a doping process, the chamber is naturally heated. Thus, self-thermal activation takes place.

Figure 5E:
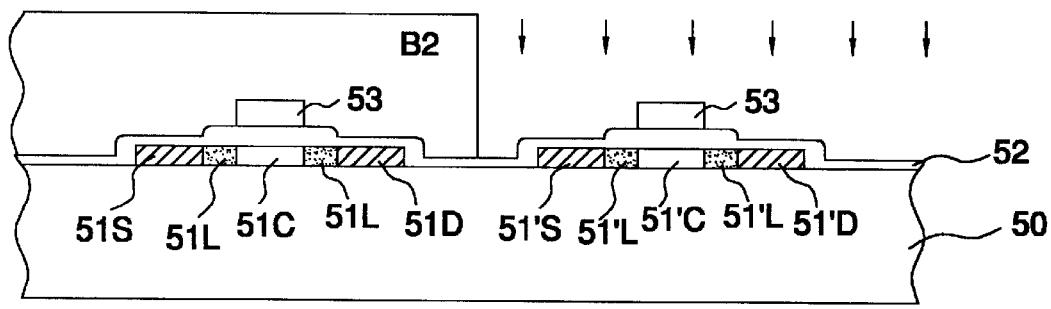

Referring to FIG. 5E, a second doping-blocking layer B2 blocking an n typed LDD TFT region is formed after the first doping-blocking layer B1 has been removed. The second doping-blocking layer B2 may be formed by such a conventional method of using photoresist as used in forming the first doping-blocking layer B1.

Then, the exposed surface of the whole substrate 50 is doped heavily with p typed impurities again. As the gate insulating layer of a p typed LDD TFT is not also uniform in its thickness, an p typed LDD regions 51'L are formed in the A' regions of the active layer which are lightly doped with impurities, while a source region 51'S and a drain region 51'D are formed in the B' region which are heavily doped with the same impurities. As explained by referring to FIG. 3 and FIG. 4, the lightly and the heavily doped region are formed in the active layer simultaneously by a single doping process.

Figure 5F:
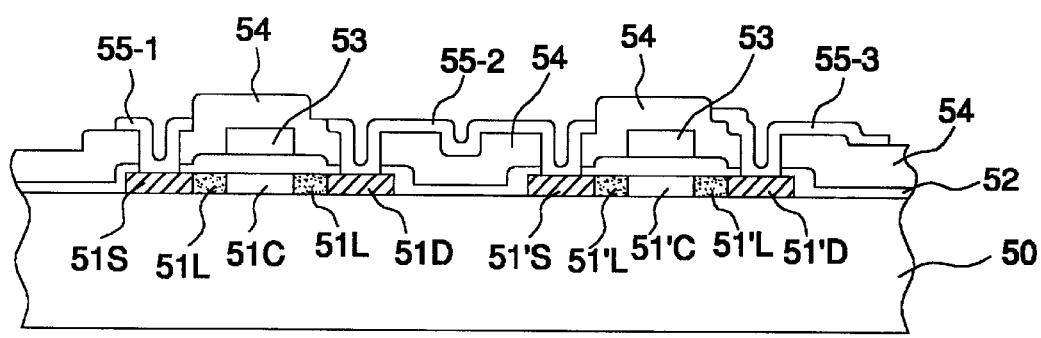

Referring to FIG. 5F, an interlayer 54 for insulation is formed thickly to cover an exposed surface of the substrate. The interlayer 54, as is the case in forming the gate insulating layer 52, may be formed by depositing an insulating material such as silicon oxide or silicon nitride by PECVD. Then, the contact holes are formed by etching predetermined portions of the interlayer 54 and the gate insulating layer 52 to expose predetermined portions of the source and the drain regions 51S, 51'S, 51D and 51'D on the n and the p typed LDD TFTs, respectively. After a second conductive layer has been formed on the exposed surfaces, connecting wires 55-1, 55-2 and 55-3 which connect the n typed LDD TFT with the p typed LDD TFT for a CMOS structure are formed by patterning the second conductive layer with photolithography.

Figure 6A:
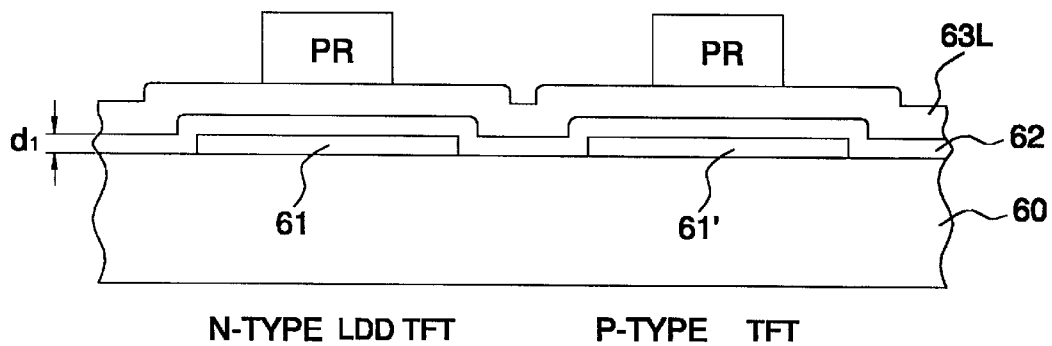
FIGS. 6A to 6G are cross-sectional views of TFT fabricating steps according to a third embodiment of the present invention.

FIGS. 6A to 6G show cross-sectional views of fabricating a CMOS TFT comprised of an n typed LDD TFT and a p typed LDD TFT according to a third embodiment of the present invention. Referring to FIGS. 6A, a polycrystalline silicon layer is formed by crystallizing an amorphous silicon layer by dehydrogenation and laser annealing process after the amorphous silicon layer has been formed on an insulated substrate 60. Then, active layers 61 and 61' of an n typed LDD TFT and a p typed LDD TFT, respectively, are formed by patterning the polycrystalline silicon layer with photolithography.

Next, a gate insulating layer 62 covering the active layers 61 and 61' and an exposed surface of the substrate are formed. And then, a first conductive layer 63L is formed on the gate insulating layer 62. Photoresist patterns (PR) for forming gates are defined on the first conductive layer 63L. In this case, the gate insulating layer 62 may be formed to have a predetermined thickness such as '$d_1$' by forming an insulating material such as silicon oxide or silicon nitride by PECVD. The first conductive layer 63L is formed by sputtering a suitable metallic conductive material, such as Mo or Cr.

Figure 6B:
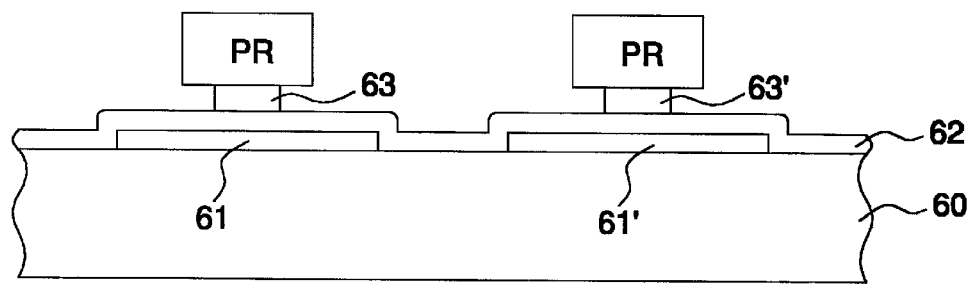

Referring to FIG. 6B, gate electrodes 63 and 63' of an n typed and a p typed LDD TFT are formed by etching the first conductive layer 63L which is not protected by the photoresist patterns (PR). Either dry or wet etching method may be used. In this case, the first conductive layer is isotropically over-etched under the photoresist pattern to form the gate electrodes 63 and 63' within the scope of each photoresist pattern (PR). Accordingly, both sides of the gate electrodes 63 and 63' amounting to '$t_L$' and '$t_R$' respectively are shortened on the bases of lateral boundaries of the photoresist patterns (PR). Resulting from an isotropic etch, the length $t_L$ substantially equals to the other length $t_R$.

Figure 6C:
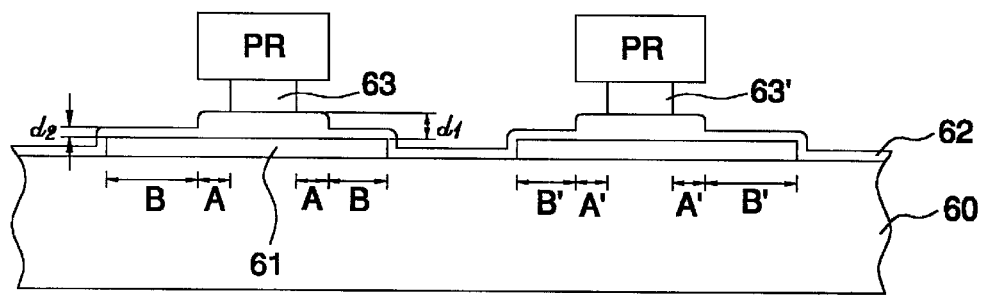

Referring to FIG. 6C, the portions of the gate insulating layer 62, which are not under the photoresist patterns (PR) as etch masks, are etched. Any suitable etching method known to one of ordinary skill in the art may be used. However, a dry-etching method is preferred. In this case, the etched portion of the gate insulating layer 62 has a thickness of $d_2$, but the non-etched portion of the gate insulating layer 62 overlapped with the photoresist pattern (PR) maintains a thickness of $d_1$ by a unisotropic etch. Accordingly, the portion of the gate insulating layer 62 not etched has a thickness of $d_1$ and the etched portions of the gate insulating layer 62 has a thickness of $d_2$.

Hereinafter, each part of the active layers, which is under the gate insulating layer having a thickness of $d_1$ and is not overlapped with the gate electrode, is called "'A' region" and "'A' region" respectively, while another each part of the active layer under the gate insulating layer having a thickness of $d_2$ is called "'B' region" and "'B' region" respectively.

Figure 6D:
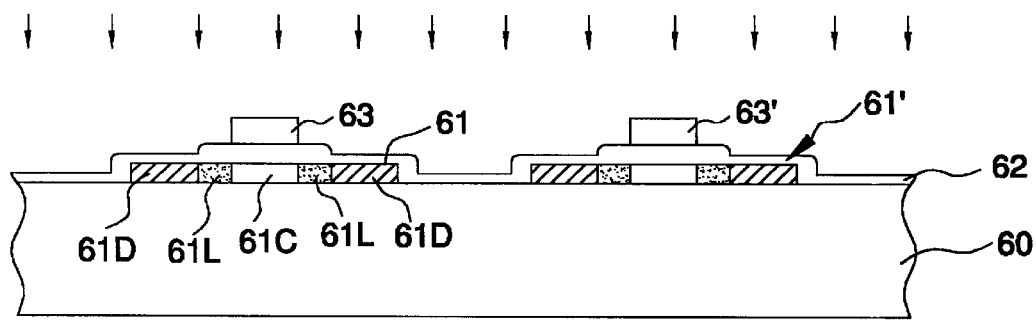

Referring to FIG. 6D, after the photoresist patterns (PR) have been removed, the exposed surface of the whole substrate 60 is doped heavily with n typed impurities. Owing to the thickness difference of the gate insulating layer 62, the A and 'A' regions of the active layer in the n and the p typed LDD TFT, respectively, are lightly doped with n typed impurities, while the B and 'B' regions of the active layer are heavily doped with the same n typed impurities. The mechanism explained in the first and the second embodiment is applicable to this embodiment as well. In this case, parts of the active layer 61 of the n typed LDD TFT which are heavily doped with n typed impurities become a source region 61S and a drain region 61D, while other parts of the active layer which are lightly doped with the n typed impurities become LDD regions 61L.

Figure 6E:
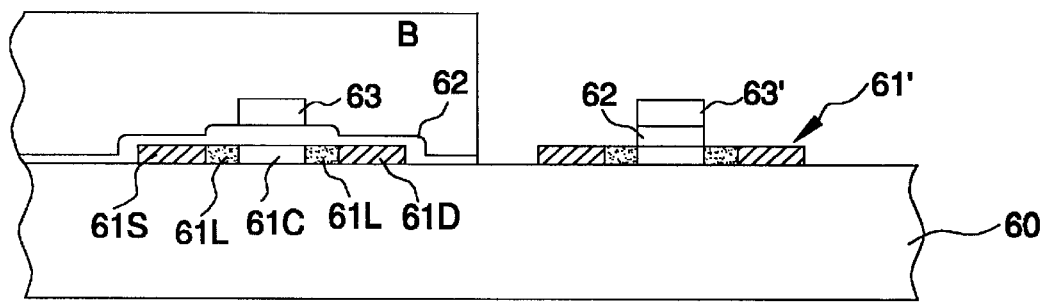

Referring to FIG. 6E, a doping-blocking layer B blocking an n typed LDD TFT region is formed. The gate insulating layer 62 is etched by using the doping-blocking layer B and the gate electrode 63' as an etch mask. As a result, the gate insulating layer 62 overlapped with the gate electrode 63' on the p typed TFT remains only.

Figure 6F:
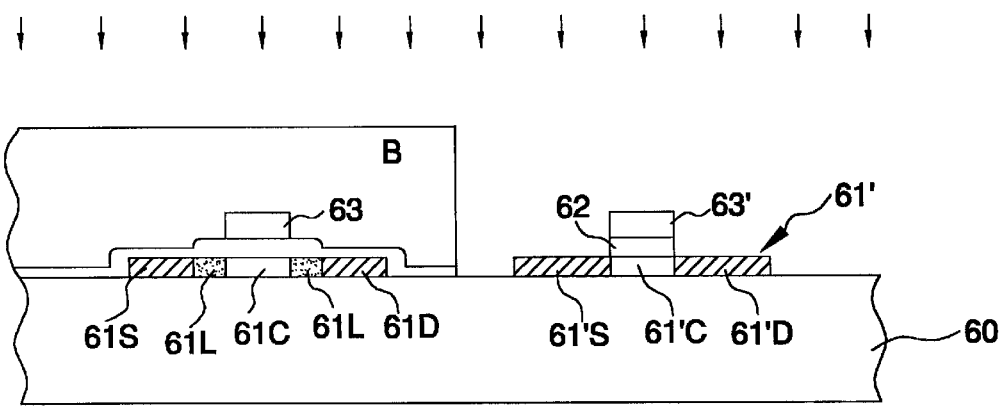

Referring to FIG. 6F, heavily doped p typed impurity regions are formed on the exposed surfaces of the p typed TFT by heavily doping the surface with p typed impurities. Both the heavily doped and lightly doped with n typed impurities transform into the heavily doped p typed impurity regions by such counter doping. The heavily doped p typed impurity regions in the active layer of the p typed TFT become a source region 61'S and a drain region 61'D.

In this case, a density of the p typed impurities should be properly adjusted to make the portions heavily counter-doped with p typed impurities turn into the heavily doped p typed impurity regions. And, an impurity-doping process may be carried out by decreasing the doping energy lower than is used in doping the active layer at the upper part of the gate insulating layer since the active layer of the p typed TFT is directly doped with the p typed impurities in the counter doping.

Figure 6G:
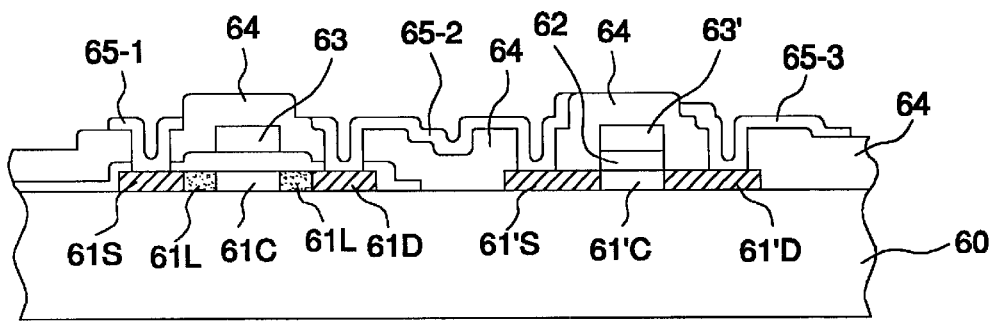

Referring to FIG. 6G, an interlayer 64 for insulation is formed thickly to cover an exposed surface of the substrate. The interlayer 64, as is the case in forming the gate insulating layer 52, may be formed by depositing an insulating material, such as silicon oxide or silicon nitride by PECVD. Then, contact holes are formed by etching predetermined portions of the interlayer 64 and the gate insulating layer 62 to expose predetermined portions of the source and the drain regions 61S, 61'S, 61D and 61'D on the n and the p typed LDD TFTs, respectively. After a second conductive layer has been formed on the exposed surfaces, connecting wires 65-1, 65-2 and 65-3 which connect the n typed LDD TFT with the p typed LDD TFT for a CMOS structure are formed by patterning the second conductive layer with photolithography.

Although the n typed LDD TFT is connected to the p typed TFT to form a CMOS transistor in the third embodiment of the present invention, a p typed LDD transistor may be connected to an n typed TFT to form a CMOS transistor by the same principle thereof. In this case, the types of the impurities are switched reciprocally.

Fabrication processes according to the present invention becomes simplified by forming a gate insulating layer of which thickness differs partially on an active layer since both a lightly doped impurity region and a heavily doped impurity region are formed simultaneously by a single doping process. Moreover, each LDD region is symmetrical in size since the LDD regions are defined by an isotropic etch by using the photoresist patterns as etch masks.

It will be apparent to those skilled in the art that various modifications and variations can be made in a method of fabricating a thin film transistor of the present invention without departing from the spirit or scope of the inventions. Thus, it is intended that the present invention cover the modifications and variations of this invention provided they come within the scope of the appended claims and equivalents.

What is claimed is:

1. CMOS thin film transistors, comprising:

a substrate;

a first-typed transistor comprising:
  an active layer having a heavily-doped impurity region, a lightly-doped impurity region and a channel region;
  a first gate insulating layer including a first part having a first thickness and a second part having a second thickness, the first part substantially overlapping with the heavily-doped impurity region, the second part substantially overlapping with the lightly-doped impurity region, wherein the first part is thinner than the second part; and
  a gate electrode arranged above the gate insulating layer over the channel region;

a second-typed transistor comprising:
  an active layer having a heavily-doped impurity region and a channel region on the substrate, without a lightly-doped region;
  a second gate insulating layer having a length substantially the same as the gate electrode; and
  a gate electrode arranged above the second gate insulating layer over the channel region; and a conductor electrically interconnecting said active layer of said first-typed transistor with said active layer of said second-typed transistor.

2. CMOS thin film transistors, comprising:

a substrate;

a first-typed transistor comprising:
  an active layer having a heavily-doped impurity region, a lightly-doped impurity region and a channel region;
  a first gate insulating layer including a first part having a first thickness and a second part having a second thickness, the first part substantially overlapping with the heavily-doped impurity region, the second part substantially overlapping with the lightly-doped impurity region, wherein the first part is thinner than the second part; and
  a gate electrode arranged above the gate insulating layer over the channel region;

a second-typed transistor comprising:
  an active layer having a heavily-doped impurity region and a channel region on the substrate, without a lightly-doped region;
  a second gate insulating layer having a length substantially the same as the gate electrode; and
  a gate electrode arranged above the second gate insulating layer over the channel region.

3. CMOS thin film transistors, comprising:

a substrate;

a first-typed transistor comprising:
  an active layer having a heavily-doped impurity region, a lightly-doped impurity region and a channel region;
  a first gate insulating layer including a first part having a first thickness and a second part having a second thickness, the first part substantially overlapping with the heavily-doped impurity region, the second part substantially overlapping with the lightly-doped impurity region, wherein the first part is thinner than the second part; and a gate electrode arranged above the gate insulating layer over the channel region;

a second-typed transistor comprising:
an active layer having a heavily-doped impurity region and a channel region on the substrate, without a lightly-doped region;
a second gate insulating layer having a length substantially the same as the gate electrode; and
a gate electrode arranged above the second gate insulating layer over the channel region;

a conductor electrically interconnecting said active layer of said first-typed transistor with said active layer of said second-typed transistor; and a passivation layer including a first part covering the first gate insulating layer on the lightly-doped region and the gate electrode, and a second part directly contacting the heavily-doped region of the second-typed transistor.

4. CMOS thin film transistors, comprising:

a substrate;

a first-typed transistor comprising:
an active layer having a heavily-doped impurity region, a lightly-doped impurity region and a channel region;
a first gate insulating layer including a first part having a first thickness and a second part having a second thickness, the first part substantially overlapping with the heavily-doped impurity region, the second part substantially overlapping with the lightly-doped impurity region, wherein the first part is thinner than the second part; and
a gate electrode arranged above the gate insulating layer over the channel region;

a second-typed transistor comprising:
an active layer having a heavily-doped impurity region and a channel region on the substrate, without a lightly-doped region;
a second gate insulating layer having a length substantially the same as the gate electrode;
a gate electrode arranged above the second gate insulating layer over the channel region; and a passivation layer including a first part covering the first gate insulating layer on the lightly-doped region and the gate electrode, and a second part directly contacting the heavily-doped region of the second-typed transistor.

5. The CMOS thin film transistors of claim 1, further comprising:

a passivation layer covering the first-typed transistor and the second-typed transistor;

a plurality of contact holes formed in the passivation layer, the plurality of contact holes exposing the heavily-doped impurity regions of the first-typed transistor and the second-typed transistor; and a plurality of wires connecting the heavily-doped impurity region of the first-typed transistor with the heavily-doped impurity region of second-typed transistor to form CMOS transistors.

6. The CMOS thin film transistors of claim 1, wherein the heavily-doped impurity region and the lightly-doped impurity region of the first-typed transistor are doped with first-typed impurities.

7. The CMOS thin film transistors of claim 1, wherein the heavily-doped impurity region of the second-typed transistor is doped with second typed impurities.

8. The CMOS thin film transistors of claim 5, wherein the plurality of wires are made of a transparent conductive material.

9. The CMOS thin film transistors of claim 2, further comprising;

a passivation layer covering the first-typed transistor and the second-typed transistor;

a plurality of contact holes formed in the passivation layer, the plurality of contact holes exposing the heavily-doped impurity regions of the first-typed transistor and the second-typed transistor; and a plurality of wires connecting the heavily-doped impurity region of the first-typed transistor with the heavily-doped impurity region of second-typed transistor to form CMOS transistors.

10. The CMOS thin film transistors of claim 2, wherein the heavily-doped impurity region and the lightly-doped impurity region of the first-typed transistor are doped with first-typed impurities.

11. The CMOS thin film transistors of claim 2, wherein the heavily-doped impurity region of the second-typed transistor is doped with second typed impurities.

12. The CMOS thin film transistors of claim 9, wherein the plurality of wires are made of a transparent conductive material.

13. A CMOS thin film transistors accordingly to claim 1, wherein said first typed transistor is N-type and said second typed transistor is P-type.

14. A CMOS thin film transistors according to claim 1, wherein said second typed transistor is doped with a first type dopant and with a second type dopant, wherein said second type dopant controls the transistor type.

15. A CMOS thin film transistors according to claim 14, wherein said first typed transistor is N-type and said second typed transistor is P-type.

16. A CMOS thin film transistors according to claim 2, wherein said first typed transistor is N-type and said second typed transistor is P-type.

17. A CMOS thin film transistors according to claim 2, wherein said second typed transistor is doped with a first type dopant and with a second type dopant, wherein said second type dopant controls the transistor type.

18. A CMOS thin film transistors according to claim 17, wherein said first typed transistor is N-type and said second typed transistor is P-type.

* * * * *